(12) United States Patent
Gaddipati et al.

(10) Patent No.: US 10,928,473 B2
(45) Date of Patent: Feb. 23, 2021

(54) METHODS AND SYSTEMS FOR REDUCED SHADING AND BLURRING IN MAGNETIC RESONANCE IMAGING

(71) Applicant: General Electric Company, Schenectady, NY (US)

(72) Inventors: Ajeetkumar Gaddipati, Waukesha, WI (US); Ali Ersoz, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 297 days.

(21) Appl. No.: 16/133,170

(22) Filed: Sep. 17, 2018

(65) Prior Publication Data

US 2020/0088821 A1   Mar. 19, 2020

(51) Int. Cl.
 *G01R 33/48* (2006.01)
 *G01R 33/565* (2006.01)

(52) U.S. Cl.
 CPC ... *G01R 33/4818* (2013.01); *G01R 33/56509* (2013.01); *G01R 33/56545* (2013.01); *G01R 33/56563* (2013.01)

(58) Field of Classification Search
 CPC ............ G01R 33/4818; G01R 33/4824; G01R 33/56509; G01R 33/56545; G01R 33/56563
 See application file for complete search history.

(56) References Cited

U.S. PATENT DOCUMENTS

| | | | |
|---|---|---|---|
| 7,023,207 B1 | 4/2006 | Gaddipati et al. | |
| 7,239,140 B1* | 7/2007 | Maier | G01R 33/56341 |
| | | | 324/309 |
| 7,382,127 B2 | 6/2008 | Gaddipati et al. | |
| 7,941,204 B1* | 5/2011 | Wang | G01R 33/5614 |
| | | | 600/420 |
| 8,154,293 B2 | 4/2012 | Li et al. | |
| 8,384,384 B2 | 2/2013 | Zhao et al. | |
| 8,664,954 B2* | 3/2014 | Hetzer | G01R 33/5616 |
| | | | 324/309 |
| 9,103,898 B2 | 8/2015 | Holmes et al. | |
| 9,322,894 B2 | 4/2016 | Gui et al. | |
| 10,197,655 B2* | 2/2019 | Umeda | G01R 33/4818 |
| 10,401,462 B2* | 9/2019 | Liu | G01R 33/56572 |
| 2008/0061779 A1* | 3/2008 | Feiweier | G01R 33/56509 |
| | | | 324/307 |

(Continued)

OTHER PUBLICATIONS

Pipe, J. et al., "Motion Correction With PROPELLER MRI: Application to Head Motion and Free-Breathing Cardiac Imaging," Magnetic Resonance in Medicine, vol. 42, No. 5, Nov. 1999, Published Online Oct. 28, 1999, 7 pages.

*Primary Examiner* — Steven L Yeninas

(57) ABSTRACT

Various methods and systems are provided for acquiring a plurality blades of k-space data for magnetic resonance (MR) data acquisition. The plurality blades are arranged in a rotational manner around a center of the k-space. Each of the blades includes a plurality of parallel phase encoding lines indexed sequentially along a phase encoding direction of the blade. The phase encoding lines of each blade are sampled according to an asymmetric phase encoding order. The blade phase encoding orders of at least two adjacent blades are opposite to each other. This results in reducing shading and blurring artifacts in MRI images.

11 Claims, 12 Drawing Sheets

(56) References Cited

U.S. PATENT DOCUMENTS

| | | | |
|---|---|---|---|
| 2008/0157767 A1* | 7/2008 | Bammer | G01R 33/5616 324/312 |
| 2009/0082656 A1* | 3/2009 | Bayram | G01R 33/561 600/410 |
| 2011/0175613 A1* | 7/2011 | Shigeta | G01R 33/4824 324/309 |
| 2013/0113482 A1* | 5/2013 | Speier | G01R 33/4818 324/309 |
| 2013/0271139 A1* | 10/2013 | Grodzki | G01R 33/482 324/314 |
| 2014/0347050 A1 | 11/2014 | Gui et al. | |
| 2016/0313431 A1* | 10/2016 | Beck | G01R 33/56509 |
| 2017/0184694 A1* | 6/2017 | Li | G01R 33/56545 |
| 2017/0261583 A1* | 9/2017 | Grodzki | G01R 33/4824 |
| 2019/0369185 A1* | 12/2019 | Setsompop | G01R 33/5602 |
| 2019/0369187 A1* | 12/2019 | Zhai | G01R 33/4824 |

* cited by examiner

METHODS AND SYSTEMS FOR REDUCED SHADING AND BLURRING IN MAGNETIC RESONANCE IMAGING

FIELD

Embodiments of the subject matter disclosed herein relate to magnetic resonance imaging, and more particularly, to k-space data acquisition for reduced shading and blurring artifacts.

BACKGROUND

Magnetic resonance imaging (MRI) is a medical imaging modality that can create images of the inside of a human body without using x-rays or other ionizing radiation. MRI systems include a superconducting magnet to create a strong, uniform, static magnetic field $B_0$. When a human body, or part of a human body, is placed in the magnetic field $B_0$, the nuclear spins associated with the hydrogen nuclei in tissue water become polarized, wherein the magnetic moments associated with these spins become preferentially aligned along the direction of the magnetic field $B_0$, resulting in a small net tissue magnetization along that axis. MRI systems also include gradient coils that produce smaller amplitude, spatially-varying magnetic fields with orthogonal axes to spatially encode the magnetic resonance (MR) signal by creating a signature resonance frequency at each location in the body. The hydrogen nuclei are excited by a radio frequency signal at or near the resonance frequency of the hydrogen nuclei, which add energy to the nuclear spin system. As the nuclear spins relax back to their rest energy state, they release the absorbed energy in the form of an RF signal. This RF signal (or MR signal) is detected by one or more RF coils and is transformed into the image using reconstruction algorithms.

BRIEF DESCRIPTION

In one embodiment, a method comprises acquiring a plurality of blades of k-space data in a rotational manner around a center of a k-space, each blade including a plurality of phase encoding lines sampled in a phase encoding order, the phase encoding order of a first blade of the plurality of blades being reversed relative to the phase encoding order of a second blade adjacent to the first blade. In this way, shading and blurring artifacts in the reconstructed MRI images may be reduced.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below.

DETAILED DESCRIPTION

Figure 1:
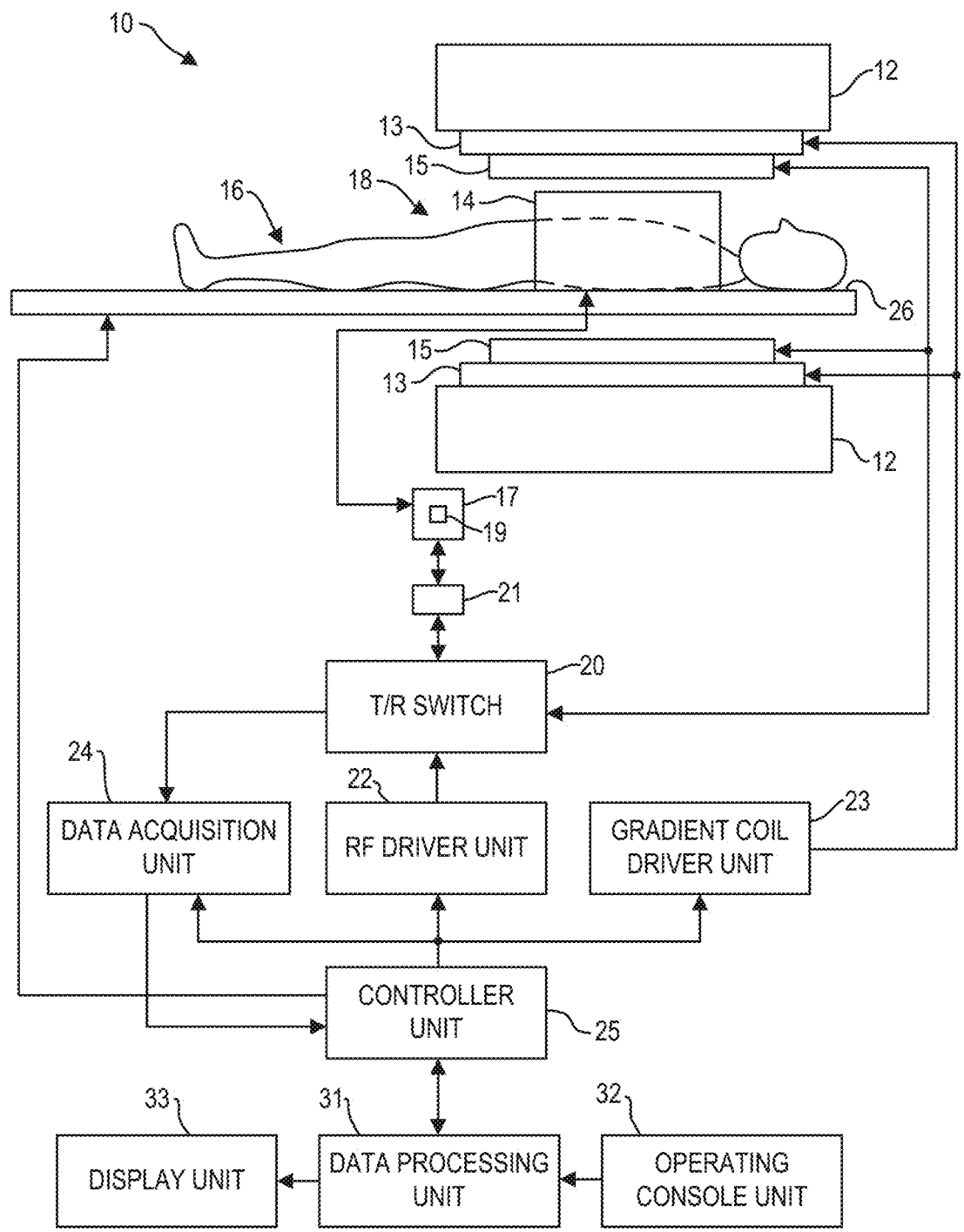
FIG. 1 is a block diagram of an MRI system according to an embodiment of the invention.

The following description relates to various embodiments for acquiring k-space data in a magnetic resonance imaging (MRI) system, such as the MRI system depicted in FIG. 1. In order to reduce motion artifacts in MR images, Periodically Rotated Overlapping Parallel Lines with Enhanced Reconstruction (PROPELLER) imaging is introduced. In PROPELLER imaging, the k-space data may be sampled from a plurality of blades of k-space data acquired in a rotational manner around the center of the k-space.

Figure 2A:
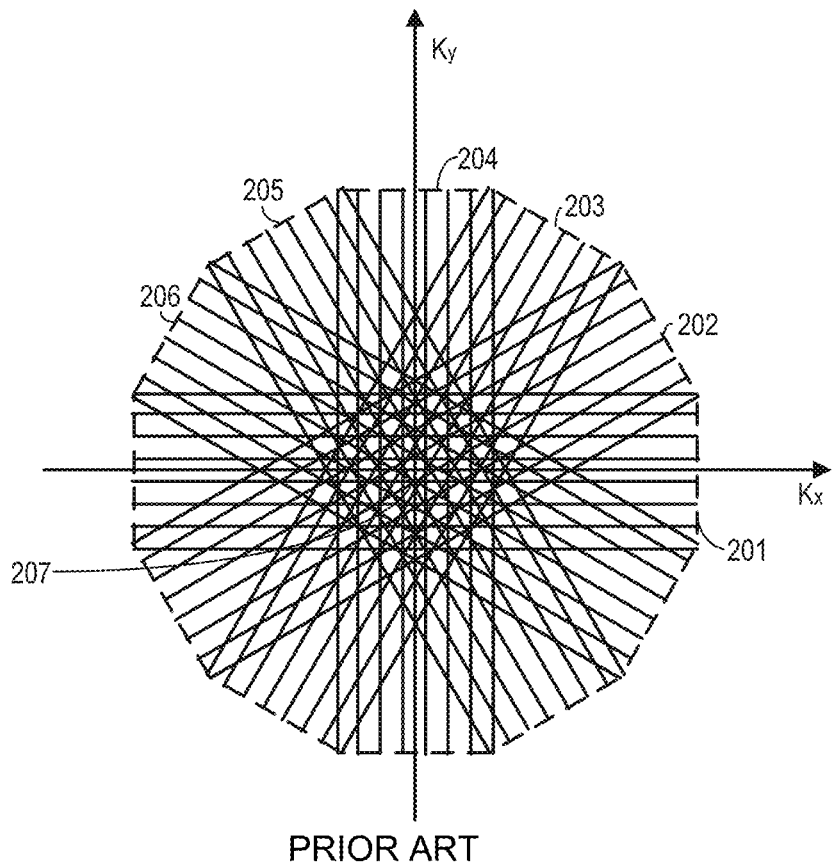
FIG. 2A illustrates plurality blades of k-space data acquired according to Periodically Rotated Overlapping Parallel Lines with Enhanced Reconstruction (PROPELLER) sampling scheme.
Figure 2B:
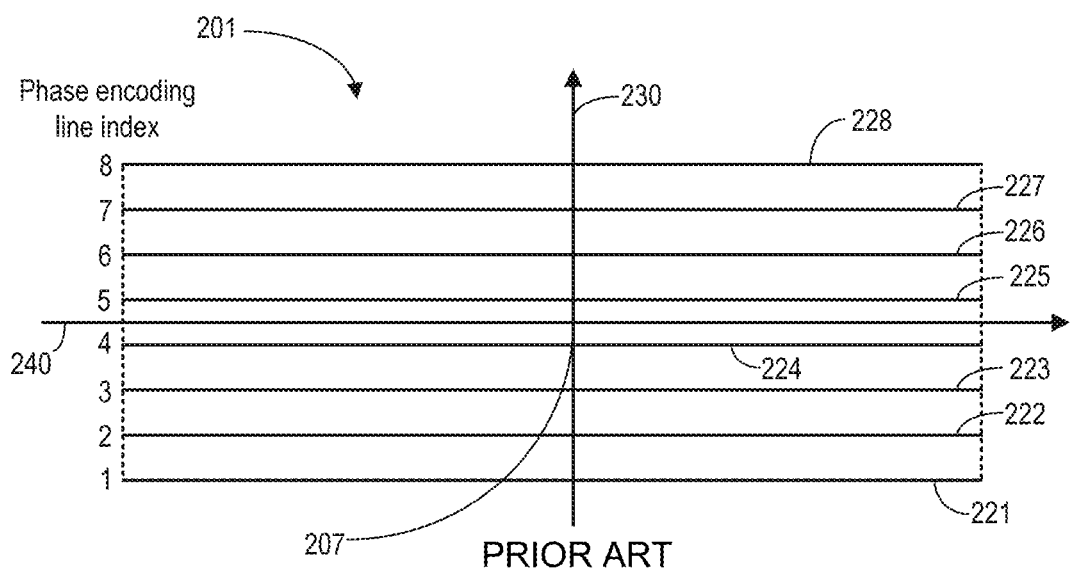
FIG. 2B illustrates phase encoding lines in one of the blades shown in FIG. 2A.

The PROPELLER sampling scheme is illustrated in FIGS. 2A and 2B. In particular, each blade of k-space data may include a plurality of parallel phase encoding lines indexed sequentially along a blade phase encoding direction. The phase encoding lines within each blade may be sampled according to a phase encoding order. The phase encoding order includes a sequence of phase encoding lines in which the phase encoding lines will be sampled, and is arranged not necessarily the same as the indexing of the phase encoding order. In conventional PROPELLER, the phase encoding order remains the same for each blade. In other words, the phase encoding lines of each blade will be sampled in the same order.

Figure 3:
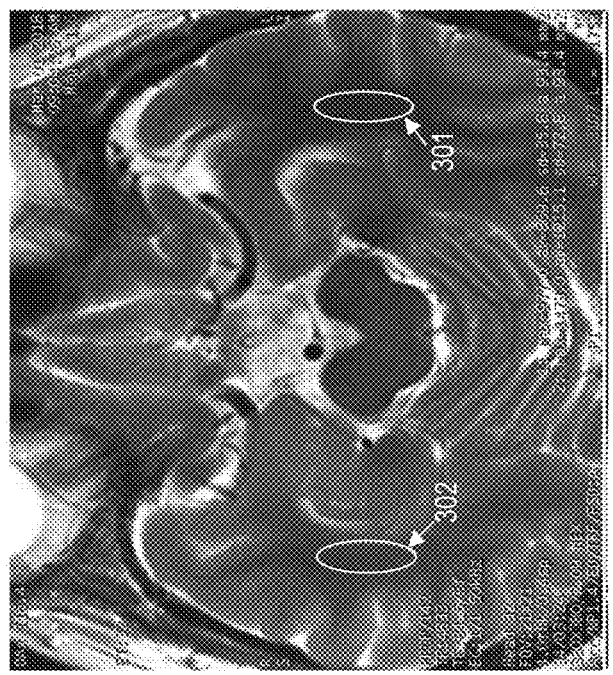
FIG. 3 shows an Mill image of brain constructed based on k-space data acquired using conventional PROPELLER sampling scheme.

However, artifacts such as shading and/or blurring may be present in MR images reconstructed from k-space data acquired according to the conventional PROPELLER sampling scheme. As an example, FIG. 3 shows an MRI image of brain constructed based on k-space data acquired with conventional PROPELLER sampling scheme. The shading artifact may be observed in FIG. 3, where the averaged pixel value inside region of interests, 301 and 302, are different.

Figure 4:
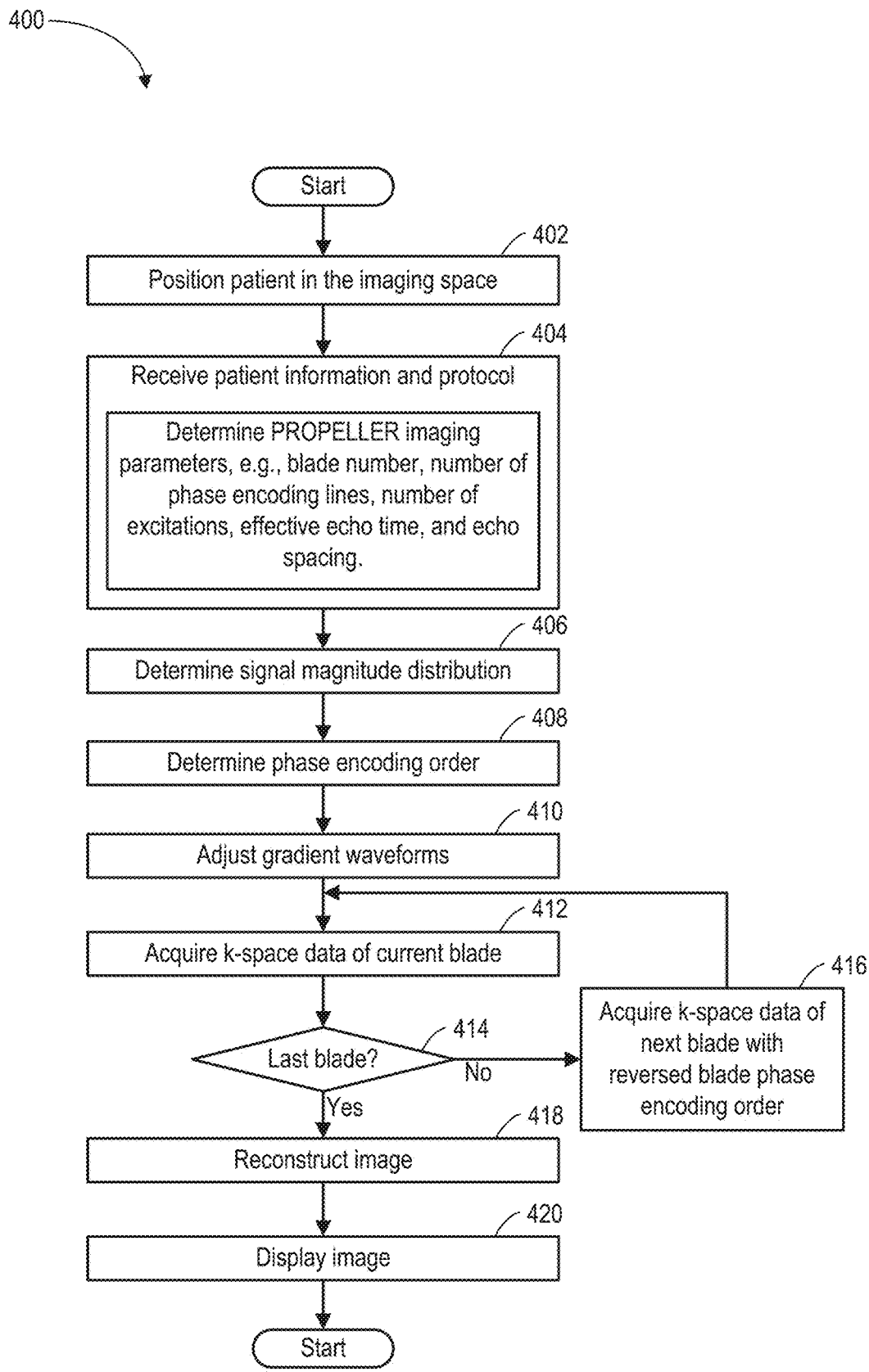
FIG. 4 is a flow chart of a method for acquiring the k-space data according to an exemplary embodiment.
Figure 5A:
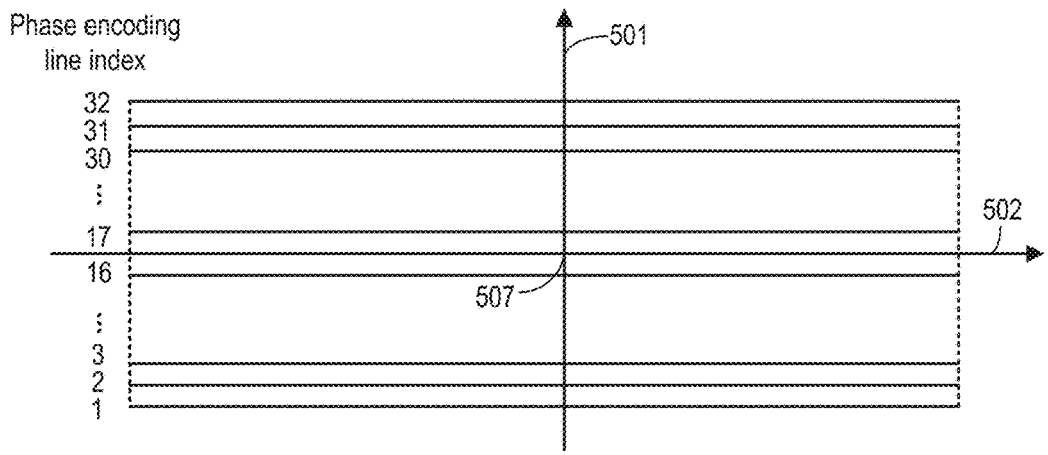
FIG. 5A shows a plurality of phase encoding lines of a blade of k-space data acquired with one excitation according to an exemplary embodiment.
Figure 5B:
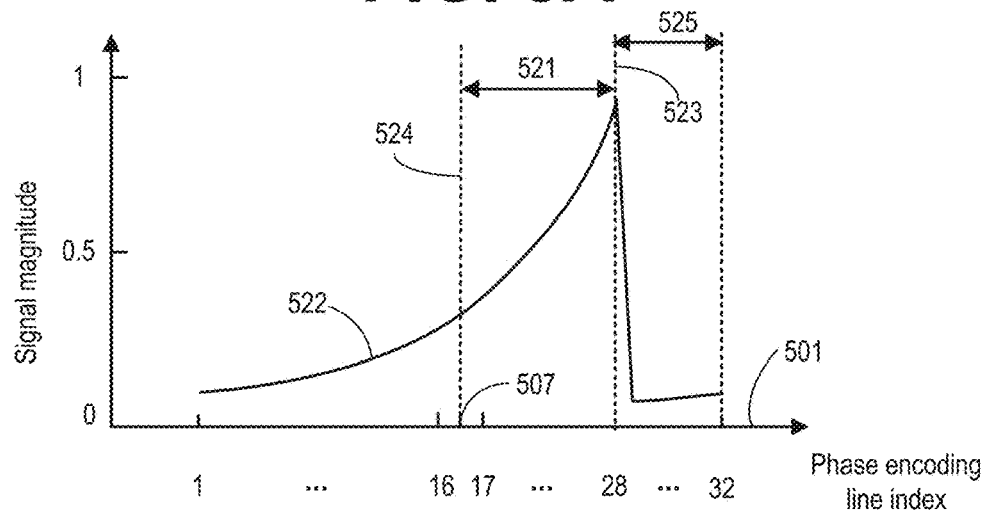
FIG. 5B is a signal magnitude distribution of a blade of k-space data acquired with one excitation according to an exemplary embodiment.
Figure 5C:
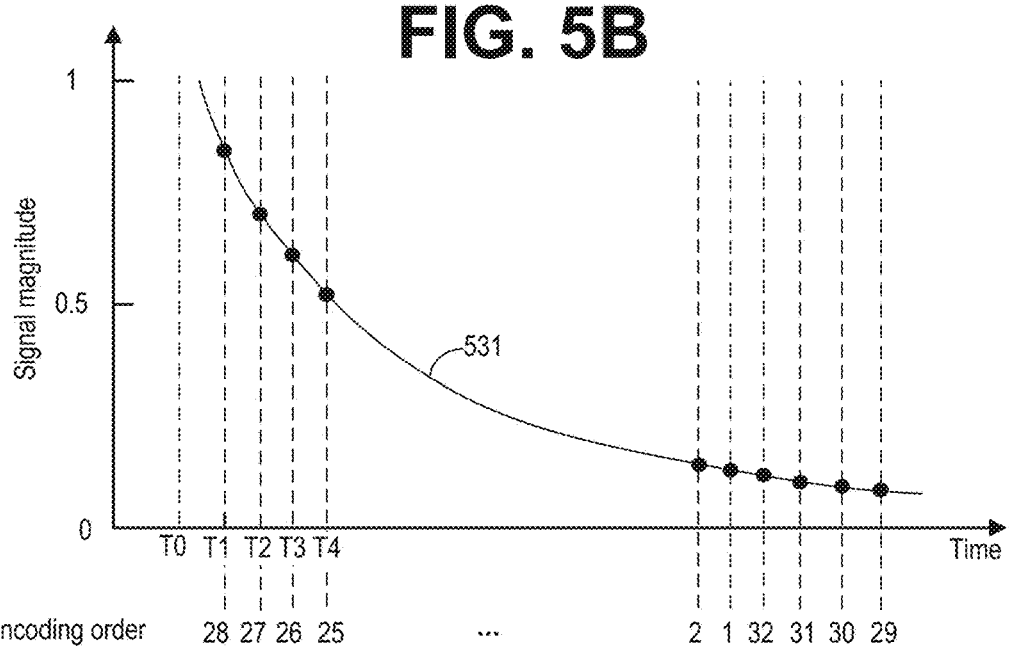
FIG. 5C shows acquired signal magnitudes of phase encoding lines of FIG. 5A over time.
Figures 6A, 6B, 6C:
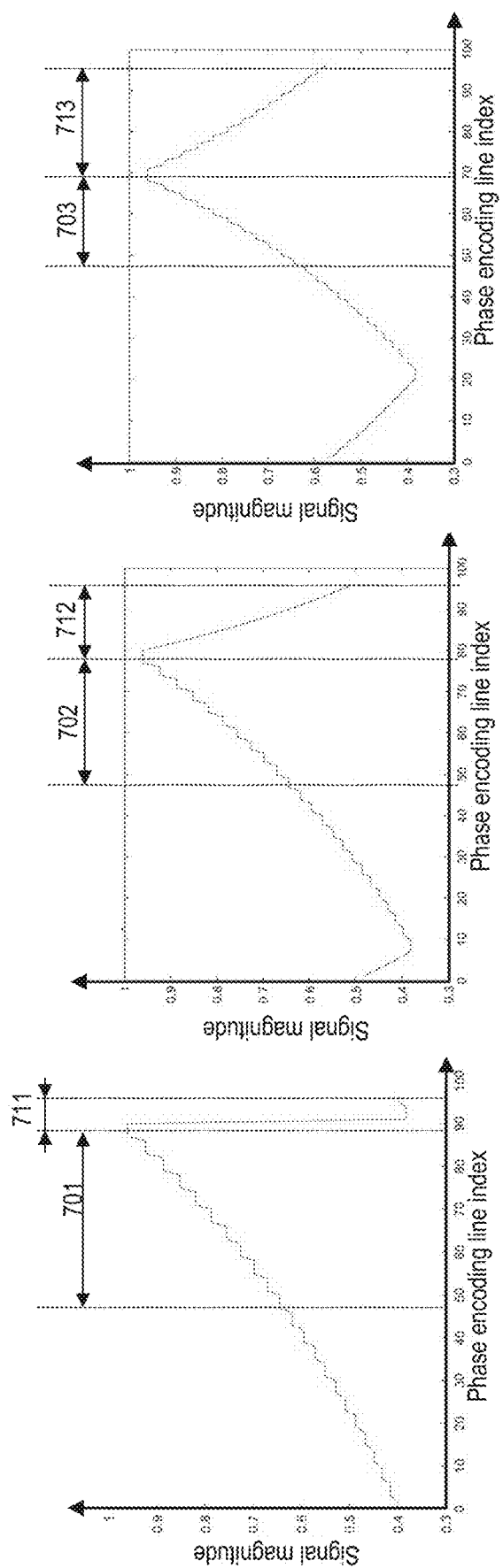
FIGS. 6A-6C show signal magnitude distributions of a blade of k-space data acquired with multiple excitations according to an exemplary embodiment.
Figure 7:
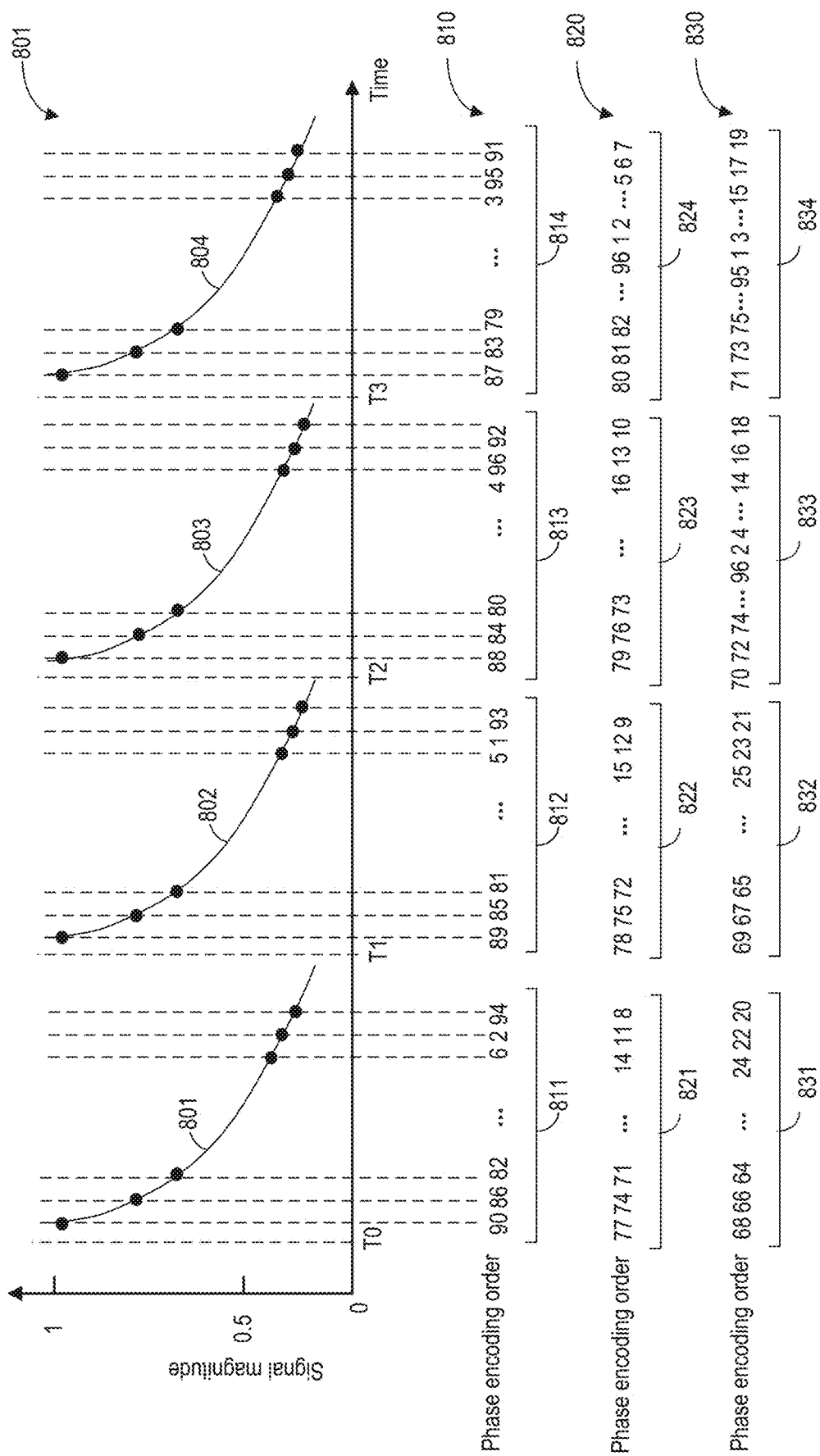
FIG. 7 shows phase encoding orders for obtaining the signal magnitude distribution of FIGS. 6A-6C.
Figure 8A:
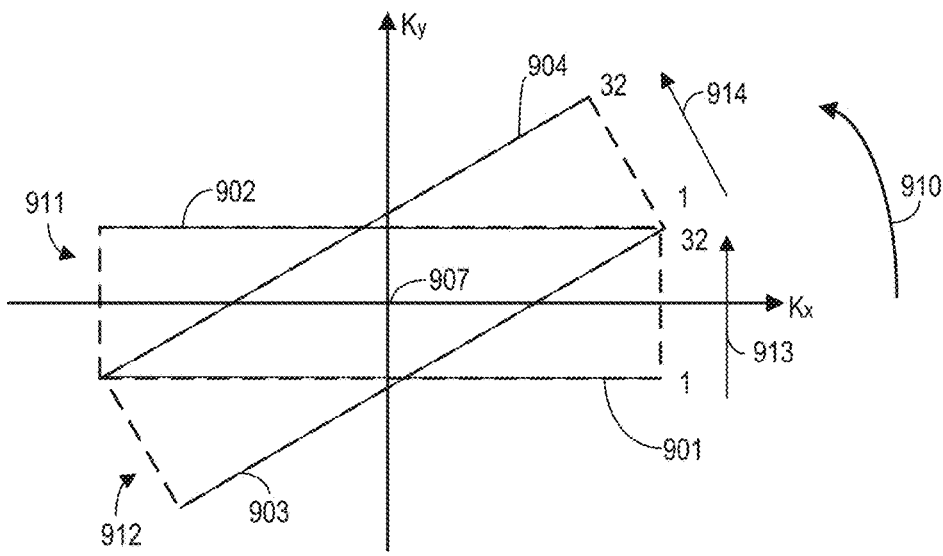
FIG. 8A illustrates two adjacent blades of k-space data acquired according to an exemplary embodiment.
Figure 9:
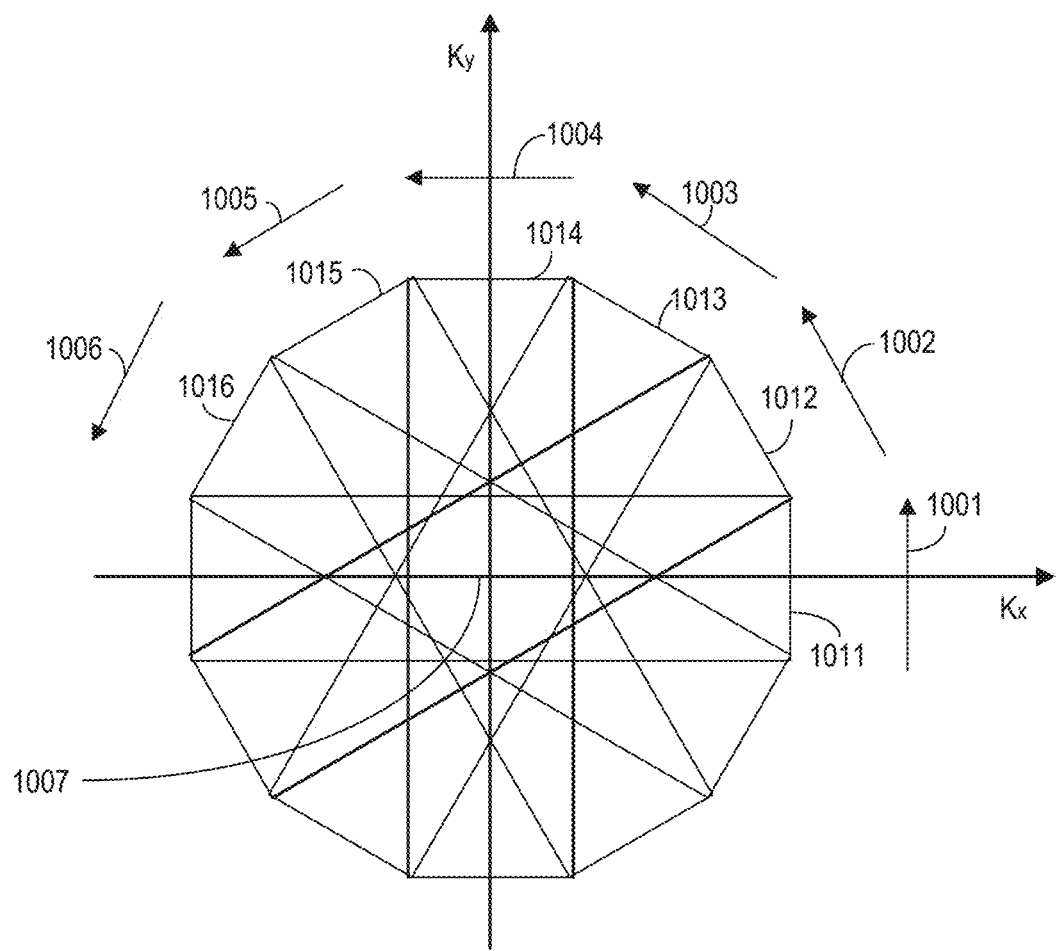
FIG. 9 illustrates an example k-space sampling scheme according to an exemplary embodiment.
Figure 10:
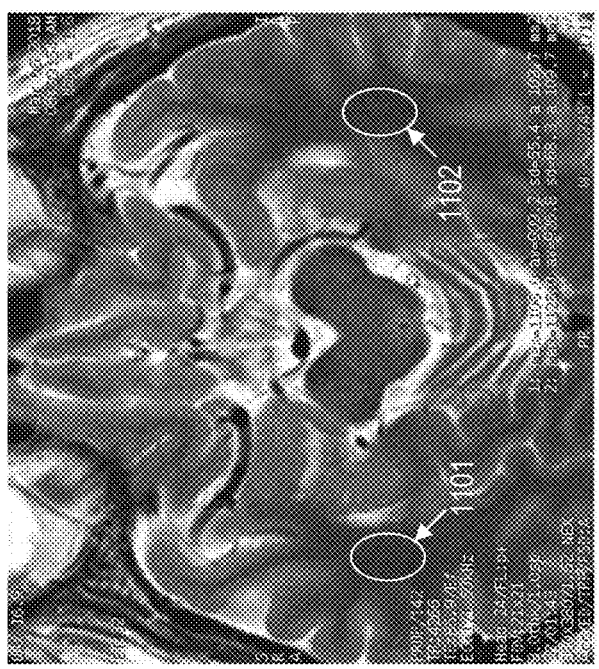
FIG. 10 shows an Mill image of brain constructed based on the k-space data acquired using the sampling scheme of FIG. 9.
Figure 11A:
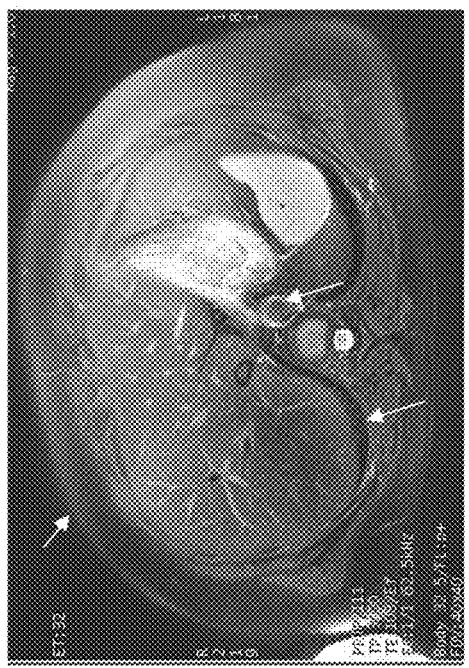
FIGS. 11A and 11B show MRI images of liver with and without blurring artifact, respectively.
Figure 11B:
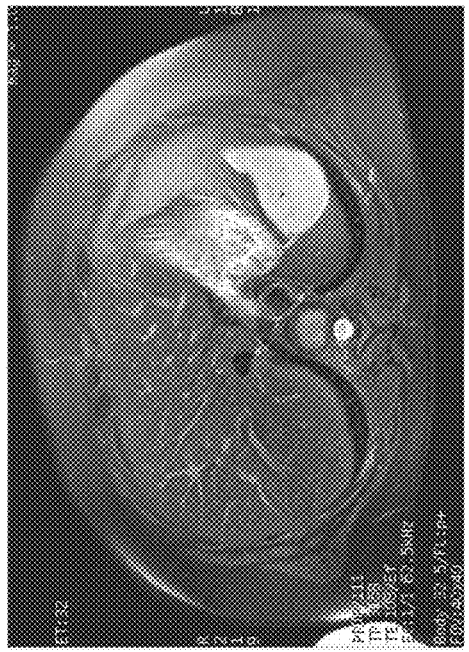
Figure 12B:
FIGS. 12A and 12B show MRI images of musculoskeletal system with and without blurring artifact, respectively.

In some embodiments, the shading and blurring artifacts may be reduced by sampling the k-space data according to the method of FIG. 4, wherein the blade phase encoding order of at least two adjacent blades are reversed, and each blade is sampled with an asymmetric phase encoding order. FIG. 5A shows the phase encoding lines of one blade indexed along the blade phase encoding direction. The phase encoding lines of the blade are filled by sampling the echoes after one excitation. The signal magnitudes of the phase encoding lines of FIG. 5A are plotted along the blade phase encoding direction in FIG. 5B. The signal magnitude distribution of FIG. 5B may be achieved by sampling the phase encoding lines according to a phase encoding order. FIG. 5C shows the signal magnitudes of phase encoding lines sampled according to the phase encoding order derived from FIG. 5B, over time. FIGS. 6A-6C show signal magnitude distributions of different numbers of asymmetry views. Each blade of k-space data in FIGS. 6A-6C are acquired with four excitations. FIG. 7 shows example phase encoding orders for obtaining the signal magnitude distributions of FIGS. 6A-6C. FIG. 8A illustrates two adjacent blades of k-space data sampled based on the method disclosed herein, wherein the blade phase encoding orders of adjacent blades are reversed. The signal magnitudes of phase encoding lines of the two adjacent blades are plotted in FIG. 8B. The blades covering 360 degrees of the k-space are illustrated in FIG. 9. By reversing the blade phase encoding orders of at least two adjacent blades, as well as sampling the phase encoding lines within each blade with an asymmetric phase encoding order, the shading artifact in brain MRI image may be reduced significantly, as shown in FIG. 10. Further, the blurring artifact in conventional PROPELLER imaging of FIGS. 11A and 12A may be removed as shown in FIGS. 11B and 12B.

FIG. 1 illustrates a magnetic resonance imaging (MRI) apparatus 10 that includes a magnetostatic field magnet unit 12, a gradient coil unit 13, an RF coil unit 14, an RF body or volume coil unit 15, a transmit/receive (T/R) switch 20, an RF driver unit 22, a gradient coil driver unit 23, a data acquisition unit 24, a controller unit 25, a patient table or bed 26, a data processing unit 31, an operating console unit 32, and a display unit 33. In some embodiments, the RF coil unit 14 is a surface coil, which is a local coil typically placed proximate to the anatomy of interest of a subject 16. Herein, the RF body coil unit 15 is a transmit coil that transmits RF signals, and the local surface RF coil unit 14 receives the MR signals. As such, the transmit body coil (e.g., RF body coil unit 15) and the surface receive coil (e.g., RF coil unit 14) are separate but electromagnetically coupled components. The MRI apparatus 10 transmits electromagnetic pulse signals to the subject 16 placed in an imaging space 18 with a static magnetic field formed to perform a scan for obtaining magnetic resonance signals from the subject 16. One or more images of the subject 16 can be reconstructed based on the magnetic resonance signals thus obtained by the scan.

The magnetostatic field magnet unit 12 includes, for example, an annular superconducting magnet, which is mounted within a toroidal vacuum vessel. The magnet defines a cylindrical space surrounding the subject 16 and generates a constant primary magnetostatic field $B_0$.

The MRI apparatus 10 also includes a gradient coil unit 13 that forms a gradient magnetic field in the imaging space 18 so as to provide the magnetic resonance signals received by the RF coil arrays with three-dimensional positional information. The gradient coil unit 13 includes three gradient coil systems, each of which generates a gradient magnetic field along one of three spatial axes perpendicular to each other, and generates a gradient field in each of a frequency encoding direction, a phase encoding direction, and a slice selection direction in accordance with the imaging condition. More specifically, the gradient coil unit 13 applies a gradient field in the slice selection direction (or scan direction) of the subject 16, to select the slice; and the RF body coil unit 15 or the local RF coil arrays may transmit an RF pulse to a selected slice of the subject 16. The gradient coil unit 13 also applies a gradient field in the phase encoding direction of the subject 16 to phase encode the magnetic resonance signals from the slice excited by the RF pulse. The gradient coil unit 13 then applies a gradient field in the frequency encoding direction of the subject 16 to frequency encode the magnetic resonance signals from the slice excited by the RF pulse.

The RF coil unit 14 is disposed, for example, to enclose the region to be imaged of the subject 16. In some examples, the RF coil unit 14 may be referred to as the surface coil or the receive coil. In the static magnetic field space or imaging space 18 where a static magnetic field $B_0$ is formed by the magnetostatic field magnet unit 12, the RF coil unit 15 transmits, based on a control signal from the controller unit 25, an RF pulse that is an electromagnet wave to the subject 16 and thereby generates a high-frequency magnetic field $B_1$. This excites a spin of protons in the slice to be imaged of the subject 16. The RF coil unit 14 receives, as a magnetic resonance signal, the electromagnetic wave generated when the proton spin thus excited in the slice to be imaged of the subject 16 returns into alignment with the initial magnetization vector. In some embodiments, the RF coil unit 14 may transmit the RF pulse and receive the MR signal. In other embodiments, the RF coil unit 14 may only be used for receiving the MR signals, but not transmitting the RF pulse.

In one embodiment, the k-space data may be sampled with a fast spin echo (FSE) pulse sequence. For example, a 90 degree excitation RF pulse may be transmitted to rotate the proton magnetization 90 degrees, then a plurality of 180 degree RF pulses may be transmitted to reverse the direction of proton precession. After each 180 degree RF pulse, an echo (MR signal) may be received from the RF coil. Herein, the 90 degree RF pulses are excitations, and the duration between consecutive 90 degree RF pulses is the repetition time (TR). Data along each phase encoding line may be acquired by sampling one echo, and multiple phase encoding lines may be acquired within the TR. In another example, the k-space data may be sampled using echo-planar pulse sequence or gradient echo pulse sequence.

The RF body coil unit 15 is disposed, for example, to enclose the imaging space 18, and produces RF magnetic field pulses orthogonal to the main magnetic field $B_0$ produced by the magnetostatic field magnet unit 12 within the imaging space 18 to excite the nuclei. In contrast to the RF coil unit 14, which may be disconnected from the MRI apparatus 10 and replaced with another RF coil unit, the RF body coil unit 15 is fixedly attached and connected to the MRI apparatus 10. Furthermore, whereas local coils such as the RF coil unit 14 can transmit to or receive signals from only a localized region of the subject 16, the RF body coil unit 15 generally has a larger coverage area. The RF body coil unit 15 may be used to transmit or receive signals to the whole body of the subject 16, for example. Using receive-only local coils and transmit body coils provides a uniform RF excitation and good image uniformity at the expense of high RF power deposited in the subject. For a transmit-receive local coil, the local coil provides the RF excitation to the region of interest and receives the MR signal, thereby decreasing the RF power deposited in the subject. It should be appreciated that the particular use of the RF coil unit 14 and/or the RF body coil unit 15 depends on the imaging application.

The T/R switch 20 can selectively electrically connect the RF body coil unit 15 to the data acquisition unit 24 when operating in receive mode, and to the RF driver unit 22 when operating in transmit mode. Similarly, the T/R switch 20 can selectively electrically connect the RF coil unit 14 to the data acquisition unit 24 when the RF coil unit 14 operates in receive mode, and to the RF driver unit 22 when operating in transmit mode. When the RF coil unit 14 and the RF body coil unit 15 are both used in a single scan, for example if the RF coil unit 14 is configured to receive MR signals and the RF body coil unit 15 is configured to transmit RF signals, then the T/R switch 20 may direct control signals from the RF driver unit 22 to the RF body coil unit 15 while directing received MR signals from the RF coil unit 14 to the data acquisition unit 24. The coils of the RF body coil unit 15 may be configured to operate in a transmit-only mode or a transmit-receive mode. The coils of the local RF coil unit 14 may be configured to operate in a transmit-receive mode or a receive-only mode.

The RF driver unit 22 includes a gate modulator (not shown), an RF power amplifier (not shown), and an RF oscillator (not shown) that are used to drive the RF coils (e.g., RF coil unit 15) and form a high-frequency magnetic field in the imaging space 18. The RF driver unit 22 modulates, based on a control signal from the controller unit 25 and using the gate modulator, the RF signal received from the RF oscillator into a signal of predetermined timing having a predetermined envelope. The RF signal modulated by the gate modulator is amplified by the RF power amplifier and then output to the RF coil unit 15.

The gradient coil driver unit 23 drives the gradient coil unit 13 based on a control signal from the controller unit 25 and thereby generates a gradient magnetic field in the imaging space 18. The gradient coil driver unit 23 includes three systems of driver circuits (not shown) corresponding to the three gradient coil systems included in the gradient coil unit 13.

The data acquisition unit 24 includes a pre-amplifier (not shown), a phase detector (not shown), and an analog/digital converter (not shown) used to acquire the magnetic resonance signals received by the RF coil unit 14. In the data acquisition unit 24, the phase detector phase detects, using the output from the RF oscillator of the RF driver unit 22 as a reference signal, the magnetic resonance signals received from the RF coil unit 14 and amplified by the pre-amplifier, and outputs the phase-detected analog magnetic resonance signals to the analog/digital converter for conversion into digital signals. The digital signals thus obtained are output to the data processing unit 31.

The MRI apparatus 10 includes a table 26 for placing the subject 16 thereon. The subject 16 may be moved inside and outside the imaging space 18 by moving the table 26 based on control signals from the controller unit 25.

The controller unit 25 includes a computer and a recording medium on which a program to be executed by the computer is recorded. The program when executed by the computer causes various parts of the apparatus to carry out operations corresponding to pre-determined scanning. The recording medium may comprise, for example, a ROM, flexible disk, hard disk, optical disk, magneto-optical disk, CD-ROM, or non-volatile memory card. The controller unit 25 is connected to the operating console unit 32 and processes the operation signals input to the operating console unit 32 and furthermore controls the table 26, RF driver unit 22, gradient coil driver unit 23, and data acquisition unit 24 by outputting control signals to them. The controller unit 25 also controls, to obtain a desired image, the data processing unit 31 and the display unit 33 based on operation signals received from the operating console unit 32.

The operating console unit 32 includes user input devices such as a touchscreen, keyboard and a mouse. The operating console unit 32 is used by an operator, for example, to input such data as an imaging protocol and to set a region where an imaging sequence is to be executed. The data about the imaging protocol and the imaging sequence execution region are output to the controller unit 25.

The data processing unit 31 includes a computer and a recording medium on which a program to be executed by the computer to perform predetermined data processing is recorded. The data processing unit 31 is connected to the controller unit 25 and performs data processing based on control signals received from the controller unit 25. The data processing unit 31 is also connected to the data acquisition unit 24 and generates spectrum data by applying various image processing operations to the magnetic resonance signals output from the data acquisition unit 24.

The display unit 33 includes a display device and displays an image on the display screen of the display device based on control signals received from the controller unit 25. The display unit 33 displays, for example, an image regarding an input item about which the operator inputs operation data from the operating console unit 32. The display unit 33 also displays a two-dimensional (2D) slice image or three-dimensional (3D) image of the subject 16 generated by the data processing unit 31.

FIGS. 2A-2B show an example sampling scheme for acquiring k-space data using PROPELLER technique. The k-space for a slice is defined by the orthogonal phase encoding axis $K_y$ and frequency encoding axis $K_x$. Arrows of the phase encoding axis and the frequency encoding axis correspond to the phase encoding direction and the frequency encoding direction, respectively. The phase encoding axis and the frequency encoding axis intersect at center 207 of the k-space.

The k-space is covered/sampled with a plurality of overlapping blades arranged in a rotational manner relative to the center 207 of the k-space. The rotation angle between adjacent blades is the same. Each blade covers a region of the k-space, and has a geometry center co-localized with the center of the k-space. In some embodiments, each blade covers a rectangular region of k-space, and the size (width and length) of the blades is the same. As one example, if the k-space is sampled with N blades, the adjacent blades are apart at an angle of 180/N degrees relative to the center of the k-space. Each blade may include a plurality of parallel phase encoding lines extending lengthwise across the blade.

As a non-limiting example, in FIG. 2A, six blades (201-206, shown in dashed line) are arranged in a rotational manner counter clockwise relative to the center 207 of the k-space to cover the 360 degrees of k-space. The adjacent blades are 30 degrees from each other. The phase encoding lines of each blade are drawn as solid lines.

Acquiring (or sampling) k-space data of the plurality of blades includes acquiring k-space data of each blade in a data acquisition direction. The data acquisition direction may be counter clockwise or clockwise relative to the k-space center. For example, k-space data of blades 201-206 may be acquired in a counter clockwise data acquisition direction. That is, the blades may be sampled in a sequence of blade 201, 202, . . . , 206. In one example, the blade with the blade phase encoding axis and the blade frequency encoding axis aligned with the phase encoding axis $K_y$ and the frequency encoding axis $K_x$ may be sampled first. By sampling the k-space with overlapping blades, the low frequency components at the center of the k-space are oversampled, while the high frequency components at the periphery of the k-space are sampled at Nyquist rate. In this way, the motion artifacts may be removed.

FIG. 2B shows one blade 201 of the blades in FIG. 2A. As a non-limiting example, blade 201 includes eight phase encoding lines 221-228 arranged in parallel along the blade phase encoding axis 230 of blade 201. The arrow of the blade phase encoding axis 230 indicates the blade phase encoding direction. The blade frequency encoding axis 240 of blade 201 is perpendicular to the blade phase encoding axis 230, and intersects with the blade phase encoding axis 230 at the center of the blade. The arrow of the blade frequency encoding axis 240 indicates the blade frequency encoding direction. The center of blade 201 coincides with the center 207 of the k-space.

The blade phase encoding lines (221-228) are indexed (e.g. numbered) sequentially from 1 to 8, along the blade phase encoding direction shown as the arrow of the blade phase encoding axis 230. In other words, the indexes (numbers) of the phase encoding lines increases in the phase encoding direction. The phase encoding lines are sampled according to a phase encoding order. The phase encoding order may be different from the phase encoding line index.

Acquiring a blade of k-space data includes acquiring data along each of the phase encoding lines of the blade. In some embodiments, the k-space data of each blade is acquired with a single excitation (such as a 90° RF pulse). After the excitation, a series of echoes (or an echo train) are acquired, and data acquired from each echo fill one phase encoding line of the blade. In other embodiments, the k-space data of each blade is acquired with a plurality of excitations. The plurality of phase encoding lines of one blade may be grouped into a plurality of groups, and the k-space data of each group of phase encoding lines is acquired with one excitation. Within each blade, the k-space data along the phase encoding lines may be sampled or filled according to a phase encoding order. The phase encoding order includes a sequence of indexes (numbers) of the phase encoding lines. For example, if the phase encoding order is 4, 5, 3, 6, 2, 7, 1, 8, the phase encoding lines are sampled/filled in the sequence of the $4^{th}$ phase encoding line, then the $5^{th}$ phase encoding line, . . . , the $1^{st}$ phase encoding line, and the $8^{th}$ phase encoding line.

In the conventional PROPELLER sampling scheme, the blade phase encoding order is the same for each blade. For example, k-space data in a first blade (such as blade 201) is filled by sampling the phase encoding lines in the phase encoding order of 4, 5, 3, 6, 2, 7, 1, 8. Then, k-space data in the second blade (such as blade 202), which is adjacent to the first blade in the data acquisition direction (such counter clockwise), is sampled in the same phase encoding order of 4, 5, 3, 6, 2, 7, 1, 8. The blade frequency encoding axis and the blade phase encoding axis of the first blade is rotated at a 180/N angle relative to the center of the k-space in the data acquisition direction (such as counter clockwise) to obtain the blade frequency encoding axis and the blade phase encoding axis of the second blade. The phase encoding lines of the second blade may be defined based on its blade frequency axis and the blade phase encoding axis. K-space data of the first and the second blades is filled by sampling the phase encoding lines in the same phase encoding order. After all of the blades of k-space data are sampled, MRI image may be reconstructed based on the blades of k-space data.

FIG. 3 shows an MRI image of a healthy brain reconstructed using conventional PROPELLER technique. In particular, when acquiring the blades of k-space data, the blade phase encoding order remains the same for all blades. Shading artifact is present in the reconstructed MRI image. Shading artifact corresponds to varied signal magnitude in different regions of the image. For example, when comparing the averaged pixel value within the first region of interest (ROI) 301 and the second ROI 302, the difference between the averaged pixel value in the second ROI 302 and the first ROI 301 is 40% of the averaged pixel value in the first ROI 301. However, in reality, the first ROI 301 and the second ROI 302 correspond to the same tissue type in left and right hemispheres of the brain, and should have substantially the same signal intensity. The artificial signal intensity difference between the first and the second ROIs is caused by shading artifact. The shading artifact may lead to misdiagnosis when a physician compares signal intensity from different regions of the MRI images, such as when comparing the signals at the left and right hemispheres of the brain.

FIG. 4 shows an example method 400 for reducing the shading and blurring artifacts when performing PROPELLER imaging using the MRI apparatus (such as the MRI apparatus 10 of FIG. 1). In particular, the blade phase encoding order of adjacent blades are reversed. In further embodiments, each blade of k-space data is acquired according to an asymmetric phase encoding order. Method 400 may be executed by controller unit 25 of FIG. 1 according to instructions stored in the non-transitory memory.

At 402, responsive to the operator's instruction, the table (such as table 26 of FIG. 1) is moved to position the subject (such as a patient) in the imaging space (such as imaging space 18 of FIG. 1).

At 404, operator input is received at the controller unit regarding the patient information and the imaging protocol. In particular, the operator input may include selection of an imaging protocol based on the anatomy that is going to be scanned. The PROPELLER imaging parameters may be determined based on the selected protocol. The PROPELLER imaging parameters may include the data acquisition direction, the number of blades for covering the k-space, the number of phase encoding lines per blade, the number of excitations for acquiring each blade of k-space data, effective echo time, echo spacing, excitation pulse repetition time, and so on. The data acquisition direction may be clockwise or counter clockwise relative to the k-space center. In some embodiments, the data acquisition direction may be determined based on the imaging protocol. In some embodiments, the data acquisition direction may be a predetermined and saved in the memory of the imaging system. The PROPELLER imaging parameters may be determined based on one or more of the imaging anatomy, imaging time frame, and expected signal to noise ratio, contrast and spatial resolution. For example, if motion is expected during the MRI scan, the number of blades and the number of phase encoding lines per blade may be increased. If the MRI scan needs to be completed in a short time frame, such as when imaging contrast agent, the number of blades and the number of phase encoding lines per blade may be decreased. If low signal to noise ratio is expected, the number of blades may be increased. The number of excitations per blade may also be increased with the increased number of phase encoding lines per blade.

At 406, a signal magnitude distribution in k-space is determined based on parameters including the number of RF excitations per blade, the effective echo time, and the number of phase encoding lines per blade. The signal magnitude distribution is the signal magnitudes of the phase encoding lines of a blade along the blade phase encoding direction. After each RF excitation, an echo train including a plurality of echoes numbered sequentially by an echo number may be sampled after applying the phase gradient and the frequency gradient. The k-space data of one phase encoding line may be filled by sampling one echo of the echo train. The signal magnitude of the echo train decreases exponentially over time after the RF excitation. The distribution of signal magnitude of the echoes (or the signal magnitude of k-space data along the phase encoding line) along the blade phase encoding axis varies based on the order that the plurality of phase encoding lines of the blade are filled. A higher signal magnitude phase encoding line is filled by sampling an echo with a lower echo number, wherein the echo number is the number of that echo generated after the RF excitation (e.g., an echo number of three corresponds to the third echo generated after the RF excitation). In order to reduce the shading and blurring artifacts in PROPELLER imaging, an asymmetric signal magnitude distribution is used.

In some embodiments, the k-space data of each blade is acquired with one RF excitation. The signal magnitude distribution may be determined based on the number of phase encoding lines, the effective echo time, and the echo spacing. FIGS. 5A-5B show an example blade and the signal magnitude distribution of the blade when the blade of k-space data is acquired using one RF excitation.

FIG. 5A shows one blade of the plurality of blades of k-space data. The blade includes 32 phase encoding lines indexed from 1 to 32 sequentially in the blade phase encoding direction (indicated by the arrow of the blade phase encoding axis 501). The phase encoding lines are parallel to the blade frequency encoding axis 502. The blade phase encoding axis 501 intersects the blade frequency encoding axis 502 at the center 507 of the k-space.

FIG. 5B illustrates an example signal magnitude distribution 522 in k-space. The y-axis shows the normalized signal magnitude. The signal magnitude increases as indicated by the arrow of the y-axis. The x-axis 501 is the blade phase encoding axis. The arrow of the x-axis indicates the blade phase encoding direction. As one example, k-space data along each phase encoding line is acquired by sampling one of the series of echoes generated after the excitation. The signal magnitude of each phase encoding line is the maximum signal magnitude of the received echo corresponding to that phase encoding line. As the maximum signal magnitudes of the echoes after the excitation decreases exponentially over time, the signal magnitude of the phase encoding line also decreases exponentially over time. A higher signal magnitude corresponds to a lower echo number, which corresponds to the echo closer to the respective RF excitation in time. For example, the signal magnitude distribution 522 peaks at the $28^{th}$ phase encoding line. Therefore, the $28^{th}$ phase encoding line has an echo number of one, that is, the $28^{th}$ phase encoding line is filled by sampling the first echo received after the RF excitation. Each phase encoding line (or each index of the phase encoding line) corresponds to one signal magnitude of the signal magnitude distribution 522.

In some embodiments, the signal magnitude distribution is asymmetric with respect to the peak signal magnitude. For example, in FIG. 5B, the signal magnitude distribution is asymmetric relative to the peak signal magnitude at 523.

In some embodiments, determining the signal magnitude distribution 522 includes determining the location of the peak of the signal magnitude distribution. The peak location may be determined based on the effective echo time and the echo spacing (that is, a duration between consecutive echoes within an echo train). For example, the distance 521 between the peak signal magnitude and the center of k-space 507 may be determined by dividing the effective echo time by the echo spacing. In another example, the location of the peak signal magnitude is selected so that the phase encoding line sampled at the effective echo time from the respective excitation is at the center of the k-space. In this way, the reconstructed image has the desired contrast.

In some embodiments, the signal magnitude distribution 522 is determined so that the maximum change rate of the signal magnitude (such as the change rate of the signal amplitude distribution between the $28^{th}$ phase encoding line and the $29^{th}$ phase encoding line) locates far away from the k-space center 507. The change rate of the signal magnitude is the variation in signal magnitude of adjacent phase encoding lines. In some embodiments, the signal magnitude distribution 522 is determined so that the change rate of the signal magnitude at the k-space center is low (e.g., the signal magnitude distribution may be selected to minimize the change rate at the k-space center, relative to other signal magnitude distributions).

In some embodiments, when each blade of k-space data is acquired using one RF excitation, the signal amplitude distribution 522 decreases monotonically from the peak at 523 to a boundary of the blade (such as the $1^{st}$ phase encoding line), passing the k-space center 507.

In one embodiment, the k-space data of each blade may be acquired with multiple RF excitations. The signal magnitude distribution in k-space may be determined based on the number of phase encoding lines, the effective echo time, the echo spacing, and a number of asymmetry views. The number of asymmetry views corresponds to the allocation of the number of phase encoding lines with the same signal magnitude relative to the peak signal magnitude in the signal magnitude distribution. The number of asymmetry views is selected so that the change rate of the signal magnitude at the k-space center is low, and the change rate of the signal magnitude around the peak signal is also relatively low. FIGS. 6A-6C show examples of signal amplitude distributions of a blade of k-space data acquired using multiple RF excitations.

FIGS. 6A-6C are signal magnitude distributions with different number of asymmetry views. Each blade of k-space data is acquired using four excitations. The x-axes are the indexes of the phase encoding lines along the blade phase encoding axis. The arrow of each x-axis indicates the blade phase encoding direction. The y-axes are the normalized signal magnitude of the phase encoding lines.

In some embodiments, determining the signal magnitude distribution includes determining a location of the peak of the signal magnitude, the change rate of the signal magnitude at the center of k-space, and the maximal change rate of the signal magnitude. Similar to the signal magnitude distribution of one excitation per blade shown in FIG. 5B, the location of the peak of the signal magnitude distribution may be determined based on the effective echo time. The distance between the peak and the center of k-space 701, 702, and 703 increases with increased quotient between the effective echo time and the echo spacing.

In some embodiments, determining the signal magnitude distribution includes selecting a number of asymmetry views based on the change rate of the signal magnitude at the center of k-space and the maximal change rate of the signal magnitude. The number of the asymmetry views as used herein, refers to an integer ranging from zero to the number of excitations divided by two. For example, if the blade of k-space data is acquired using four excitations, the number of asymmetry views may be 0, 1, or 2. Since the blade of phase encoding data is acquired via four excitations, four phase encoding lines of the blade have the same signal magnitude. The number of asymmetry views corresponds to the allocation of the number of phase encoding lines with the same signal magnitude relative to the peak signal magnitude in the signal magnitude distribution.

For example, in FIG. 6A, the number of asymmetry views is zero, i.e., no phase encoding lines are arranged between the maximal signal magnitude at the $90^{th}$ phase encoding line and the minimal signal magnitude at the 91° phase encoding line. In FIG. 6B, the number of asymmetry views is one, i.e., at each signal magnitude, one phase encoding line is arranged on the side of the peak signal magnitude with a higher phase encoding line index, between the maximal signal magnitude at the $80^{th}$ phase encoding line and the boundary of the blade at the $96^{th}$ phase encoding line. At each signal magnitude, three phase encoding lines are arranged between the minimal signal magnitude at the $8^{th}$ phase encoding line and the maximal signal magnitude at the $80^{th}$ phase encoding line. In FIG. 6C, the number of asymmetry views is two, i.e., at each signal magnitude, two phase encoding lines are arranged on the side of the peak magnitude with the higher phase encoding line index, from the $70^{th}$ phase encoding line to the boundary of the blade at the $96^{th}$ phase encoding line. Two phase encoding lines are arranged on the other side of the peak magnitude with lower phase encoding line index, between the maximal signal magnitude at the $70^{th}$ phase encoding line and the minimal signal magnitude at the $22^{nd}$ phase encoding line.

In some embodiments, the number of asymmetry views is determined so that the change rate of the signal magnitude distribution (that is, the variation of signal amplitude between consecutive phase encoding lines) at the center of k-space is minimized (e.g., relative to other signal magnitude distributions), and the maximum change rate of the signal magnitude distribution is minimized (e.g., relative to other signal magnitude distributions). With increased number of asymmetry views, the change rate of the signal magnitude distribution at the k-space center may increase, and the maximum change rate decreases. For example, FIG. 6A has the lowest change rate at the k-space center relative to FIGS. 6B and 6C, while FIG. 6C has the lowest maximum change rate relative to FIGS. 6A and 6B. Thus, there is a tradeoff between the change rate of the signal magnitude distribution at the k-space center and the maximum change rate. In some embodiments, the signal magnitude distribution of FIG. 6B may be selected to satisfy both the low change rate at the k-space center and the low maximum change rate. Further, the number of asymmetry views may be adjusted based on specific imaging protocol.

Turning back to FIG. 4, at 408, the phase encoding order of each blade is determined based on the signal magnitude distribution in k-space at 406. The phase encoding order is the order that the phase encoding lines of each blade are sampled. In some embodiments, the phase encoding lines of each blade are indexed incrementally along the blade phase encoding direction. The phase encoding order dictates the order in which the phase encoding lines will be sampled or filled with k-space data. The phase encoding lines may not necessarily be sampled in the same order that the phase encoding lines are indexed. FIG. 5C illustrates the phase encoding order derived from the signal magnitude distribution 522 of FIG. 5B. FIG. 7 illustrates the phase encoding orders derived from the signal magnitude distributions of FIGS. 6A-6C.

FIG. 5C illustrates the signal magnitude of phase encoding lines sampled according to the phase encoding order derived from the signal magnitude distribution 522, over time. The x-axis is time, and the time increases as indicated by the arrow. The y-axis is the normalized signal magnitude of the phase encoding lines. The signal magnitude increases as indicated by the arrow of the y-axis. The phase encoding lines are sampled with one excitation (such as a 90 degree RF pulse) occurring at time T0. After the excitation at T0, the signal magnitude 531 of the series of echoes after the excitation decays exponentially. Each dot along the signal magnitude 531 corresponds to the signal magnitude of a particular phase encoding line. The phase encoding line corresponding to echo number 1 is filled at T1, the phase encoding line corresponding to echo number 2 is sampled at T2, and so forth.

In FIG. 5B, the value of the signal magnitude is inversely related to the echo number. Since the signal magnitude peaks at the $28^{th}$ phase encoding line, the $28^{th}$ phase encoding line (corresponds to echo number 1) is first sampled. Since the signal magnitude decreases from the $28^{th}$ phase encoding line to the $1^{st}$ phase encoding line, after the $28^{th}$ phase encoding line is sampled, the phase encoding lines are sampled sequentially in a descending order from the $27^{th}$ phase encoding line to the $1^{st}$ phase encoding line. After the $1^{st}$ phase encoding line is sampled, the phase encoding lines are sampled sequentially in a descending order from 32 to 29. In some embodiments, if the blade of k-space data is acquired using one RF excitation, one phase encoding order may be determined based on the signal magnitude distribution. In some embodiments, if the blade of phase encoding data is acquired via multiple excitations, a plurality of phase encoding orders may be determined based on one signal magnitude curve.

Turning to FIG. 7, plot 801 shows the timeline for sampling k-space data of one blade. The x-axis of plot 801 is time, and the time increases as indicated by the arrow. The y-axis of plot 801 is normalized signal magnitude of the phase encoding lines, and the signal magnitude increases as indicated by the arrow. While acquiring the blade of k-space data, four RF excitations are initiated at time T0, T1, T2, and T3, respectively. After each excitation, the signal magnitudes 801, 802, 803, and 804 increase first, then decrease exponentially over time.

The phase encoding order 810 is one example sequence for sampling the phase encoding lines to obtain the signal magnitude distribution shown in FIG. 6A. The phase encoding lines of the phase encoding order 810 are grouped into four groups 811, 812, 813, and 814. Each group includes 24 phase encoding lines, and each group corresponds to the echoes generated after one excitation. After the first excitation at T0, phase encoding lines in group 811 are first filled. For example, the $90^{th}$ phase encoding line is filled first. Then, the $86^{th}$ phase encoding line is filled, then the $82^{nd}$ phase encoding line is filled, and so forth. The phase encoding lines are filled in the descending order until the $2^{nd}$ phase encoding line. The $94^{th}$ phase encoding line is filled in the end. After the second excitation at T1, phase encoding lines in group 812 are filled. For example, the $89^{th}$ phase encoding line is filled first. Then, the $85^{th}$ phase encoding line is filled. The phase encoding lines are filled in the descending order until the 1st phase encoding line. The 93$^{rd}$ phase encoding line is filled in the end. After the third excitation at T2, phase encoding lines in group 813 are filled. For example, the 88$^{th}$ phase encoding line is filled first. Then, the 84$^{th}$ phase encoding line is filled. The phase encoding lines are filled in the descending order until the 4$^{th}$ phase encoding line. The 96$^{th}$ and the 92$^{th}$ phase encoding lines are filled in the end. After the fourth excitation at T3, phase encoding lines in group 814 are filled. For example, the 87$^{th}$ phase encoding line is filled first. Then, the 83$^{th}$ phase encoding line is filled. The phase encoding lines are filled in the descending order until the 3$^{rd}$ phase encoding line. The 95$^{th}$ and the 91$^{st}$ phase encoding lines are filled in the end.

The phase encoding order 820 is one example sequence for sampling the phase encoding lines to obtain the signal magnitude distribution shown in FIG. 6B. Similar to the phase encoding order 810, the phase encoding lines of the phase encoding order 820 are grouped into four groups 821, 822, 823, and 824. Each group includes 24 phase encoding lines. The k-space data of each group of phase encoding lines is filled with one excitation. The k-space data of groups 821, 822, 823, and 824 are filled after the excitations at T0, T1, T2, and T3, respectively. Different from the phase encoding order of 810, the signal with the highest magnitude is sampled with the 77$^{th}$, 78$^{th}$, 79$^{th}$, and 80$^{st}$ phase encoding lines. As a result, positions of the maximum signal magnitude along the blade phase encoding direction in FIG. 6B is different from FIG. 6A.

The phase encoding order 830 is one example sequence for sampling the phase encoding lines to obtain the signal magnitude distribution shown in FIG. 6C. The phase encoding lines of the phase encoding order 830 are grouped into four groups 831, 832, 833, and 834. Each group includes 24 phase encoding lines. The k-space data of each group of phase encoding lines is filled with one excitation. The k-space data of groups 831, 832, 833, and 834 are filled after the excitations at T0, T1, T2, and T3, respectively. Different from the phase encoding order of 810, the signal with the highest magnitude is sampled with the 68$^{th}$, 69$^{th}$, 70$^{th}$, and 71$^{st}$ phase encoding lines.

In some embodiments, one or more of the phase encoding indexes in the phase encoding order may be skipped during data acquisition. In other words, data of one or more of the phase encoding lines may not be acquired by sampling the echoes after the excitation. Instead, the data of these phase encoding lines may be estimated based on the data of other phase encoding lines. By skipping one or more of the phase encoding indexes in the phase encoding order, data acquisition time for each blade of k-space data may be reduced. However, skipping one or more phase encoding indexes does not change the signal magnitude distribution in k-space.

In some embodiments, a set of phase encoding orders may be determined for a plurality of imaging protocols before a scan, and saved in the memory of the imaging system. During the scan, the phase encoding order may be selected from the saved phase encoding orders based on the selected protocol at 404.

Returning to FIG. 4, at 410, the gradient waveforms are adjusted for acquiring the blade of k-space data. For example, the gradient waveforms are adjusted by rotating a transformation matrix that is updated by a rotational angle between current blade and the k-space, so that the orientation of the blade phase encoding direction and the blade frequency direction are rotated to the desired blade position.

At 412, the k-space data of the current blade is acquired based on the phase encoding order determined at 408 and the number of excitations determined at 404. Acquiring the blade of k-space data includes sampling the plurality of phase encoding lines of each blade according to the phase encoding order. In one example, each phase encoding line of the blade is filled by sampling one echo generated after the excitation. In another example, one or more of the phase encoding line indexes in the phase encoding order may be skipped, and the skipped phase encoding lines are filled based on the data of other phase encoding lines. Acquiring the k-space data may further include data processing procedures to remove motion artifacts in the acquired k-space data within each blade.

At 414, the controller determines whether all blades of the k-space data are acquired. If all blades of k-space data are acquired, an image is reconstructed on the blades of k-space data at 418, which is described in more detail below. If not all blades of the k-space data are acquired, method 400 proceeds to 416.

At 416, k-space data of the next, adjacent blade, in the data acquisition direction is acquired. In one example, the next blade is angled or rotated by 180/N degrees relative to the current blade, where N is the number of blades of k-space data that is to be acquired. The position of the next blade may be obtained by rotating both the blade phase encoding axis and the blade frequency encoding axis of the current blade 180/N degrees relative to the center of the k-space (which also results in the blade phase encoding direction being rotated by 180/N degrees relative to the center of the k-space). Then, the blade phase encoding order of the next blade may be obtained by reversing the phase encoding order of the adjacent blade.

Figure 8B:
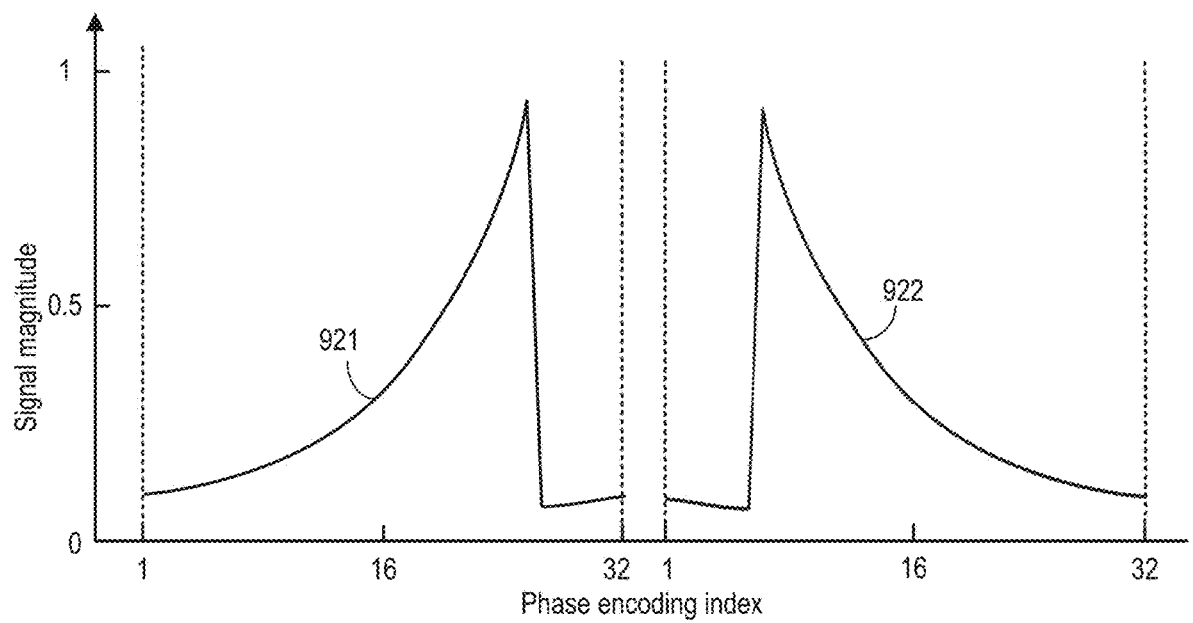
FIG. 8B is a graph showing signal magnitude distribution of the two adjacent blades of FIG. 8A.

FIGS. 8A and 8B illustrate the blade phase encoding orders of two adjacent blades, and the signal magnitudes of the phase encoding lines of the blades. In FIG. 8A, the x-axis is the frequency encoding axis of k-space ($K_x$), and y-axis is the phase encoding axis of the k-space ($K_y$). The arrows of the x-axis and the y-axis indicate the frequency encoding direction and the phase encoding direction of the k-space. The frequency encoding axis and the phase encoding axis intersect at the center 907 of the k-space. The k-space data of blade 911 is acquired first. Blade 911 includes 32 phase encoding lines indexed incrementally in the blade phase encoding direction 913. Herein, only the 1$^{st}$ phase encoding line 901 and the 32$^{nd}$ phase encoding line 902 are shown. The blade phase encoding direction 913 is parallel to the phase encoding axis of the k-space and extends in the same direction (e.g., in the positive $K_y$ direction). After acquiring the k-space data of blade 911, k-space data of blade 912 is acquired. Blade 912 is positioned an angle of 180/N degrees counter clockwise (shown as data acquisition direction 910) relative to the center 907 of the k-space. To obtain the blade phase encoding direction 914 of blade 912, the blade phase encoding direction 913 is rotated 180/N degrees counter clockwise in the data acquisition direction 910. The blade phase encoding direction 914 extends at an angle relative to the phase encoding axis of the k-space (e.g., the blade phase encoding direction 914 is not parallel to $K_y$). The phase encoding lines of blade 912 are indexed incrementally in the blade phase encoding direction 914.

FIG. 8B shows the signal magnitudes of the phase encoding lines of two adjacent blades 911 and 912 along the data acquisition direction 910 (herein, counter clockwise relative to the center of k-space). The curve 921 corresponds to the signal magnitude curve of the blade 911, and curve 922 corresponds to the signal magnitude curve of the blade 912.

The x-axis is the phase encoding indexes of the two blades arranged along the blade rotation direction 910. Blade 912 is sampled in a reversed phase encoding order compared to blade 911. In one example, the phase encoding order may be reversed by reversing (or flipping) the signal magnitude distribution of the blade. In some embodiments, the phase encoding order may be reversed by reversing the order of the phase encoding indexes along the phase encoding direction while keeping the phase encoding direction unchanged. In some embodiments, the phase encoding order may be reversed by reversing the phase encoding direction while keeping the phase encoding indexes unchanged.

FIG. 9 shows six blades covering 360 degrees of the k-space. The x-axis is the frequency encoding axis $K_x$, and the y-axis is the phase encoding axis $K_y$. The six blades of k-space data (1011-1016) are arranged in a rotational manner counter clockwise relative to the center of k-space 1007. The blade phase encoding directions of the six blades 1011, 1012, 1013, 1014, 1015, and 1016 are 1001, 1002, 1003, 1004, 1005, and 1006, respectively.

Returning to FIG. 4, after rotating the blade and reversing the blade phase encoding order, method 400 loops back to 412 to acquire the k-space data of the subsequent blade. The process of rotating the blade, reversing the blade phase encoding order, and acquiring the k-space data for the subsequent blades repeats until it is determined that all blades of k-space data have been acquired. Upon determining that the last blade of k-space data has been acquired, method 400 proceeds to 418 where, after all blades of k-space data are collected, the MRI image is reconstructed based on the k-space data. Reconstructing the MRI image based on the k-space data includes converting the k-space data to the image space. Reconstructing the image may also include data processing procedures for removing motion artifacts in the acquired blades of k-space data.

At 420, the reconstructed image may be displayed. For example, the image may be displayed via the display unit 33 of FIG. 1. Additionally or alternatively, the reconstructed image may be saved in memory, e.g., a memory of system 10 or a remote memory.

In this way, during an MRI scan, a plurality of blades of k-space data may be acquired in a rotational manner around a center of a k-space. Each blade may include a plurality of phase encoding lines indexed sequentially along a respective blade phase encoding direction. During data acquisition, the plurality of phase encoding lines are sampled in a phase encoding order. The phase encoding order is the order in which the phase encoding lines are sampled. To reduce shading and blurring artifacts, the blade phase encoding order of a first blade is reversed relative to the blade phase encoding order a second blade adjacent to the first blade. Further, the phase encoding order of each blade may be selected to generate an asymmetric signal magnitude distribution.

The scanning protocol may define, among other elements, the anatomy being scanned and various parameters of the MRI scan, including effective echo time and number of excitations per blade. The effective echo time and number of excitations per blade may be used to select the phase encoding order.

The order in which the phase encoding lines are sampled is chosen so that the signal amplitude distribution meets several criteria that the inventors herein have recognized will reduce shading artifact. These criteria include an asymmetric distribution, such that the distribution around the peak signal amplitude is not symmetric. The criteria further include minimizing the slope (e.g., change rate) of the distribution at the center of k-space and minimizing the maximum slope of the distribution. Further still, the phase encoding order is selected such that the center of k-space is sampled at the effective echo time.

As appreciated by FIGS. 6A-6C, if more than one excitation is provided per blade, additional variations on the target signal magnitude distribution are possible. However, it may be desirable to still meet the above criteria. In particular, when the number of asymmetry views is set at two as shown in FIG. 6C, the distribution may not minimize the change rate at the center of k-space. FIG. 6B may be selected to minimize the change rate at the center of k-space while also providing a relatively low change rate at the edge of k-space. However, each different distribution may be desirable depending on the scanning protocol and may be effective at reducing shading artifact.

In some examples, each scanning protocol may include a predefined phase encoding order that is associated with the scanning protocol. In such examples, the predefined phase encoding order may be retrieved from memory, for example, when the scanning protocol is selected, and during data acquisition, the phase encoding lines may be sampled in the predefined order. In other examples, the scanning protocol may include various parameters that may be used to select a phase encoding order, such as the effective echo time, echo spacing, and number of excitations per blade. These parameters may be used to determine the phase encoding order as explained above. In some examples, the operator may select the phase encoding order, the operator may select the number of asymmetry views, or the operator may provide other input that may be used to select the appropriate phase encoding order.

After the phase encoding order is selected, a first blade of k-space data is acquired according to the phase encoding order. Then, an adjacent blade of k-space data is acquired. The adjacent blade of k-space data may be acquired according to the phase encoding order, but in reverse. For example, the phase encoding order used to acquire the data for the first blade may include the order shown in FIG. 5C (e.g., 28, 27, 26 . . . 2, 1, 32, 31, 30, and 29). The reversed phase encoding order is used to acquire the data for the second blade (e.g., 5, 6, 7, . . . 30, 31, 32, 1, 2, 3, and 4).

FIG. 10 shows an MRI image of a healthy brain reconstructed from k-space data acquired using the method as disclosed herein. The blade shading artifact is significantly reduced compared to the shading artifact shown in FIG. 3. For example, the difference between the averaged pixel value in the second ROI 1102 is 2% of the averaged pixel value in the first ROI 1101.

The k-space sampling method of FIG. 4 can also reduce the blurring artifacts. FIG. 11A and FIG. 11B show MRI images of liver with and without blurring artifact, respectively. The k-space data used for reconstructing the image shown in FIG. 11A was acquired using conventional PROPELLER imaging. The k-space data used for constructing the image shown in FIG. 11B was acquired using PROPELLER imaging with reversing blade phase encoding orders of adjacent blades and asymmetric phase encoding order for each blade. Arrows in FIG. 11A point to the blurring and haze at the boundary of the tissue/air interface. In FIG. 11B, the blurring and the haze artifacts are reduced, and the tissue/air boundary is sharper compared to FIG. 11A.

Figure 12A:
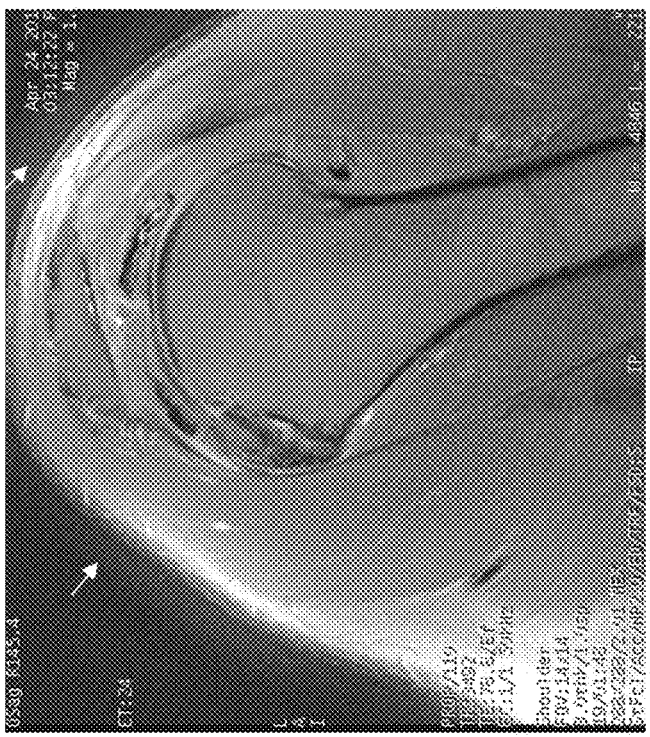

FIG. 12A and FIG. 12B show MRI images of musculoskeletal system with and without blurring artifact, respectively. The k-space data used for reconstructing the image shown in FIG. 12A was acquired using conventional PROPELLER imaging. The k-space data used for constructing the image shown in FIG. 12B was acquired using PROPELLER imaging with reversing blade phase encoding orders of adjacent blades and asymmetric phase encoding order for each blade. Arrows in FIG. 12A point to the blurring and haze at the boundary of the tissue/air interface. In FIG. 12B, the blurring and the haze artifacts are reduced, and the tissue/air boundary is sharper compared to FIG. 12A.

The technical effect of reversing the blade phase encoding orders of at least two adjacent blades of k-space data and sampling the phase encoding lines with asymmetric phase encoding order is that the fluctuations in signal magnitudes across the imaging slice are reduced. Further, the sharpness of the image, especially the sharpness at the tissue boundaries, is improved. The technical effect of determining the asymmetric phase encoding order based on the number of excitations per blade is that the phase encoding order is more robust to effects of system imperfections on image quality.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for magnetic resonance imaging (MRI), comprising:
   acquiring a plurality of blades of k-space data in a rotational manner around a center of a k-space, each blade including a plurality of phase encoding lines sampled in a phase encoding order, the blade phase encoding direction of a first blade of the plurality of blades being reversed relative to the blade phase encoding direction of a second blade phase adjacent to the first blade;
   determining the phase encoding order of the first blade based on a signal magnitude distribution of the plurality of phase encoding lines in the k-space;
   determining the signal magnitude distribution in k-space, and wherein determining the signal magnitude distribution includes determining at least one of a location of a peak signal magnitude, a change rate of the signal magnitude distribution at the center of the k-space center, and a maximum of the change rate of the signal magnitude distribution; and
   sampling data along each of the phase encoding lines of the plurality phase encoding lines by sampling an echo of a plurality of echoes generated with a plurality of excitations, and wherein determining the signal amplitude distribution further includes selecting a number of asymmetry views to reduce the change rate at the center of the k-space and reduce the maximum of the change rate of the signal magnitude, wherein the number of asymmetry views corresponds to a number of the phase encoding lines of a particular signal magnitude between the peak signal magnitude and a boundary of the blade of the k-space data.

2. The method of claim 1, wherein the signal magnitude distribution is asymmetric with respect to a peak in the signal magnitude distribution.

3. The method of claim 1, wherein the location of the peak signal magnitude is determined based on an effective echo time.

4. The method of claim 1, wherein the signal magnitude distribution decreases monotonically from the peak signal magnitude to a minimal signal magnitude, passing the center of the k-space.

5. A magnetic resonance imaging (MRI) apparatus, comprising:
   a plurality of gradient field coils configured to encode positional information;
   a controller unit coupled to the gradient field coils for adjusting a location to sample data in a k-space; and
   a memory storing executable instructions that, when executed, cause the controller unit to:
   acquire a plurality of blades of k-space data in a rotational manner around a center of a k-space, each blade including a plurality of phase encoding lines sampled in a phase encoding order, the blade phase encoding direction of a first blade of the plurality of blades being reversed relative to the blade phase encoding direction of a second blade phase adjacent to the first blade;
   determine the phase encoding order of the first blade based on a signal magnitude distribution of the plurality of phase encoding lines in the k-space;
   determine the signal magnitude distribution in k-space by determining at least one of a location of a peak signal magnitude, a change rate of the signal magnitude distribution at the center of the k-space center, and a maximum of the change rate of the signal magnitude distribution;
   sample data along each of the phase encoding lines of the plurality phase encoding lines by sampling an echo of a plurality of echoes generated with a plurality of excitations, and wherein determining the signal amplitude distribution further includes selecting a number of asymmetry views to reduce the change rate at the center of the k-space and reduce the maximum of the change rate of the signal magnitude, wherein the number of asymmetry views corresponds to a number of the phase encoding lines of a particular signal magnitude between the peak signal magnitude and a boundary of the blade of the k-space data.

6. The apparatus of claim 5, wherein the signal magnitude distribution is asymmetric with respect to a peak in the signal magnitude distribution.

7. The apparatus of claim 5, wherein the location of the peak signal magnitude is determined based on an effective echo time.

8. The apparatus of claim 5, wherein the signal magnitude distribution decreases monotonically from the peak signal magnitude to a minimal signal magnitude, passing the center of the k-space.

9. A non-transitory computer-readable medium comprising instructions that, when executed, cause a processor to:
- acquire a plurality of blades of k-space data in a rotational manner around a center of a k-space, each blade including a plurality of phase encoding lines sampled in a phase encoding order, the blade phase encoding direction of a first blade of the plurality of blades being reversed relative to the blade phase encoding direction of a second blade phase adjacent to the first blade;
- determine the phase encoding order of the first blade based on a signal magnitude distribution of the plurality of phase encoding lines in the k-space, and wherein the signal magnitude distribution is asymmetric with respect to a peak in the signal magnitude distribution;
- determine the signal magnitude distribution in k-space by determining at least one of a location of a peak signal magnitude, a change rate of the signal magnitude distribution at the center of the k-space center, and a maximum of the change rate of the signal magnitude distribution;
- sample data along each of the phase encoding lines of the plurality phase encoding lines by sampling an echo of a plurality of echoes generated with a plurality of excitations, and wherein determining the signal amplitude distribution further includes selecting a number of asymmetry views to reduce the change rate at the center of the k-space and reduce the maximum of the change rate of the signal magnitude, wherein the number of asymmetry views corresponds to a number of the phase encoding lines of a particular signal magnitude between the peak signal magnitude and a boundary of the blade of the k-space data.

10. The computer-readable medium of claim 9, wherein the location of the peak signal magnitude is determined based on an effective echo time.

11. The computer-readable medium of claim 9, wherein the signal magnitude distribution decreases monotonically from the peak signal magnitude to a minimal signal magnitude, passing the center of the k-space.

* * * * *